United States Patent
Engelhardt et al.

(10) Patent No.: US 9,966,832 B1
(45) Date of Patent: May 8, 2018

(54) PREDICTIVE RIPPLE-CANCELLING SIGNAL INTO ERROR AMPLIFIER OF SWITCH MODE POWER SUPPLY

(71) Applicant: Linear Technology Corporation, Milpitas, CA (US)

(72) Inventors: Michael T. Engelhardt, Sunnyvale, CA (US); Leonard Shtargot, Campbell, CA (US)

(73) Assignee: Linear Technology Corporation, Milpitas, CA (US)

( * ) Notice: Subject to any disclaimer, the term of this patent is extended or adjusted under 35 U.S.C. 154(b) by 0 days. days.

(21) Appl. No.: 15/590,305

(22) Filed: May 9, 2017

(51) Int. Cl.
| | |
|---|---|
| *H02M 1/15* | (2006.01) |
| *H02M 1/14* | (2006.01) |
| *H02M 3/156* | (2006.01) |
| *H03K 5/134* | (2014.01) |
| *H03K 5/135* | (2006.01) |
| *H03K 5/14* | (2014.01) |
| *H03K 17/16* | (2006.01) |
| *H02M 1/00* | (2006.01) |
| *H02M 1/38* | (2007.01) |

(52) U.S. Cl.
CPC ............ *H02M 1/143* (2013.01); *H02M 1/15* (2013.01); *H02M 3/156* (2013.01); *H03K 5/134* (2014.07); *H03K 5/135* (2013.01); *H03K 5/14* (2013.01); *H03K 17/165* (2013.01); *H02M 2001/0025* (2013.01); *H02M 2001/385* (2013.01); *H02M 2003/1566* (2013.01)

(58) Field of Classification Search
CPC .......... H02M 1/14; H02M 1/143; H02M 1/15; H02M 3/156; H02M 3/158; H02M 2001/0025; H02M 2001/385; H02M 2003/156; H02M 2003/158; H03K 5/134; H03K 5/135; H03K 5/14
See application file for complete search history.

(56) References Cited

U.S. PATENT DOCUMENTS

| | | | | |
|---|---|---|---|---|
| 8,581,564 | B2 * | 11/2013 | Sumitomo | H02M 3/156 323/282 |
| 8,842,225 | B2 * | 9/2014 | Murakami | H02M 3/1582 323/271 |
| 8,952,668 | B2 * | 2/2015 | Makoto | H02M 3/156 323/282 |

(Continued)

*Primary Examiner* — Matthew Nguyen
(74) *Attorney, Agent, or Firm* — Brian D. Ogonowsky; Patent Law Group LLP

(57) ABSTRACT

A predicted ripple in the feedback voltage of a switching converter is generated, based on the ripple over a certain number of recent switching cycles. The DC portion of the feedback voltage is filtered out. This predicted feedback voltage ripple is then added to a fixed reference voltage to create a compensated reference voltage. The compensated reference voltage is applied to the non-inverting input of an error amplifier, and the feedback voltage (having a DC component and ripple) is applied to the inverting input of the error amplifier. Thus, substantially the same ripple component is applied to both inputs and cancels out. Therefore, the output of the error amplifier is not affected by the ripple in the feedback voltage, and a non-rippling control voltage is generated by the error amplifier. As a result, the gain-bandwidth product of the converter can be increased for faster response to transients.

22 Claims, 3 Drawing Sheets

(56) References Cited

U.S. PATENT DOCUMENTS

| | | | |
|---|---|---|---|
| 2014/0253082 A1* | 9/2014 | Swanson | H02M 3/156 323/284 |
| 2014/0347027 A1* | 11/2014 | Jayaraj | H02M 3/1563 323/282 |
| 2015/0263617 A1* | 9/2015 | Xue | H02M 3/156 323/271 |
| 2015/0381037 A1* | 12/2015 | Romeo | H02M 3/156 323/282 |
| 2016/0006354 A1* | 1/2016 | Yamaguchi | H02M 3/1563 323/282 |

* cited by examiner

PREDICTIVE RIPPLE-CANCELLING SIGNAL INTO ERROR AMPLIFIER OF SWITCH MODE POWER SUPPLY

FIELD OF THE INVENTION

This invention relates to switch mode power supplies, such as DC/DC converters, and, in particular, to a technique to offset ripple in the feedback voltage applied to an error amplifier.

BACKGROUND

FIG. 1 illustrates one type of prior art current mode DC/DC switching power supply, also known as a current mode DC/DC converter. Many other converter types, such as a switching voltage mode converter, can also benefit from the present invention. The type of converter shown in FIG. 1 is a peak current mode converter.

The operation of the converter is conventional and is as follows.

A clock (CLK) signal is applied to the set input of an RS flip-flop 20.

The setting of the RS flip-flop 20 generates a high signal at its Q output. A logic circuit 24, in response, turns transistor switch 26 on and turns the synchronous rectifier switch 28 off. Both switches may be MOSFETs or other types of transistors. A diode may replace the synchronous rectifier switch 28. The logic circuit 24 ensures that there is no cross-conduction of switches 26 and 28. The input voltage Vin applied to an inductor L1 through the switch 26 causes a ramping current to flow through the inductor L1, and this current flows through a low value sense resistor 32. The ramping current is filtered by an output capacitor 36 and supplies current to the load 38. The output capacitor 36 is relatively large to smooth out ripple.

The output voltage Vout is applied to a voltage divider 42, and the divided voltage is applied to the inverting input of a transconductance error amplifier 44. Capacitors may be connected across the resistors in the divider 42 to further compensate the feedback loop. A reference voltage Vref is applied to the non-inverting input of the amplifier 44. The output current of the amplifier 44 corresponds to the difference between the actual output voltage Vout and the desired output voltage. The voltage (a control voltage Vc) at a capacitor 46, connected to the output of the amplifier 44, is adjusted up or down based on the positive or negative current output of the amplifier 44. The control voltage Vc, among other things, sets the duty cycle of the switch 26, and the level of the control voltage Vc is that needed to equalize the inputs into the amplifier 44.

The control voltage Vc is applied to a comparator 50. The ramping voltage drop across the sense resistor 32, when the switch 26 is on, is sensed by a differential amplifier 52, having a certain gain, which outputs the voltage Visense. Many other ways are known to create the voltage Visense. When the voltage Visense exceeds the control voltage Vc, the comparator 50 is tripped to output a reset pulse to the RS flip-flop 20. This turns the switch 26 off and turns the synchronous rectifier switch 28 on to discharge the inductor L1, causing a downward ramping current. In this way, the peak current through the inductor L1 for each cycle is regulated to generate a desired output voltage Vout. The current through the sense resistor 32 includes a DC component (the lower frequency, average current) and an AC component (the higher frequency, ripple current).

FIG. 1 also illustrates a conventional slope compensation circuit 59, as is well known for current mode power converters. At high duty cycles (typically near or greater than 50%), the slope compensation circuit 59 ensures any duty cycle perturbations, such as caused by load current perturbations, are damped out. The slope compensation circuit 59 typically generates a ramping voltage that is subtracted from the control voltage Vc to create a downward ramping control voltage that is compared to the voltage Visense. The comparator 50 combines the control voltage Vc with the ramping voltage to create a compensated control voltage for comparison with the voltage Visense. The effect of the slope compensation circuit 59 is unrelated to the present invention.

The feedback voltage Vfb has ripple (at the switching frequency), and this ripple causes the control voltage Vc to have some ripple. This affects the accuracy of the tripping of the comparator 50.

FIG. 2 illustrates examples of the ramping voltage Visense, the rippling feedback voltage Vfb, the fixed reference voltage Vref, the rippling control voltage Vc (as a result of the constant Vref and rippling Vfb), and the average control voltage Vc (dashed line). The DC portions of Vfb, Visense, and Vc are not shown. The peak-to-peak ripple of the feedback voltage Vfb is just a small percentage of the nominal feedback voltage Vfb. The comparator 50 trips when the up-ramping voltage Visense crosses the control voltage Vc. Note that the comparator 50 trips earlier than had the control voltage Vc been a smoother voltage approximately equal to the average control voltage Vc. This may create an inaccuracy in the output voltage Vout. Further, for transient situations, where a large feedback voltage ripple is experienced, the error amplifier may operate out of its linear region, creating possible DC error due to asymmetrical up and down slew limits of the error amplifier. Still further, the ripple in the control voltage Vc may interact with the slope compensation function to cause variations in the duty cycle.

The various ripples may be lessened by adding capacitance to the output and to the control voltage Vc node, but increasing the capacitance reduces the gain-bandwidth product and thus reduces the converter's ability to react to transients.

What is needed is a technique for use in a switching converter that does not suffer from the drawbacks of the rippling feedback voltage Vfb and rippling control voltage Vc.

SUMMARY

The present invention mitigates the adverse effects of ripple in the feedback voltage Vfb of a switching power supply (a converter). The converter may be a voltage mode converter, a current mode converter, or other type of switching converter. A current mode converter is used as an example.

In one embodiment, a predicted ripple in the feedback voltage Vfb is generated, based on the ripple over a certain number of recent switching cycles. The DC portion of the feedback voltage Vfb is filtered out. This predicted feedback voltage ripple Vfb(ripple) is then added to the fixed reference voltage Vref to effectively create a compensated reference voltage.

The sum of the reference voltage Vref and the predicted feedback voltage ripple Vfb(ripple) is then applied to the non-inverting input of the error amplifier. The conventional feedback voltage Vfb (having a DC component and ripple) is applied to the inverting input of the error amplifier. Thus, the same ripple component is applied to both inputs and cancels out. Therefore, the output of the error amplifier is not affected by the ripple in the feedback voltage Vfb, and a non-rippling control voltage Vc is generated by the error amplifier. This results in various benefits.

The same beneficial effect can be achieved by subtracting the predicted feedback voltage ripple Vfb(ripple) from the feedback voltage Vfb.

The benefits include: 1) a more accurate output voltage Vout; 2) the output capacitor and Vc node capacitor values can be reduced to increase the gain-bandwidth product to improve the response of the converter to transients; 3) the error amplifier stays in its linear region despite high ripple operation; and 4) the control voltage Vc does not interfere with the slope compensation.

Various other embodiments are described.

BRIEF DESCRIPTION OF THE DRAWINGS

Elements that are the same or equivalent are labeled with the same numeral.

DETAILED DESCRIPTION

Figure 3:
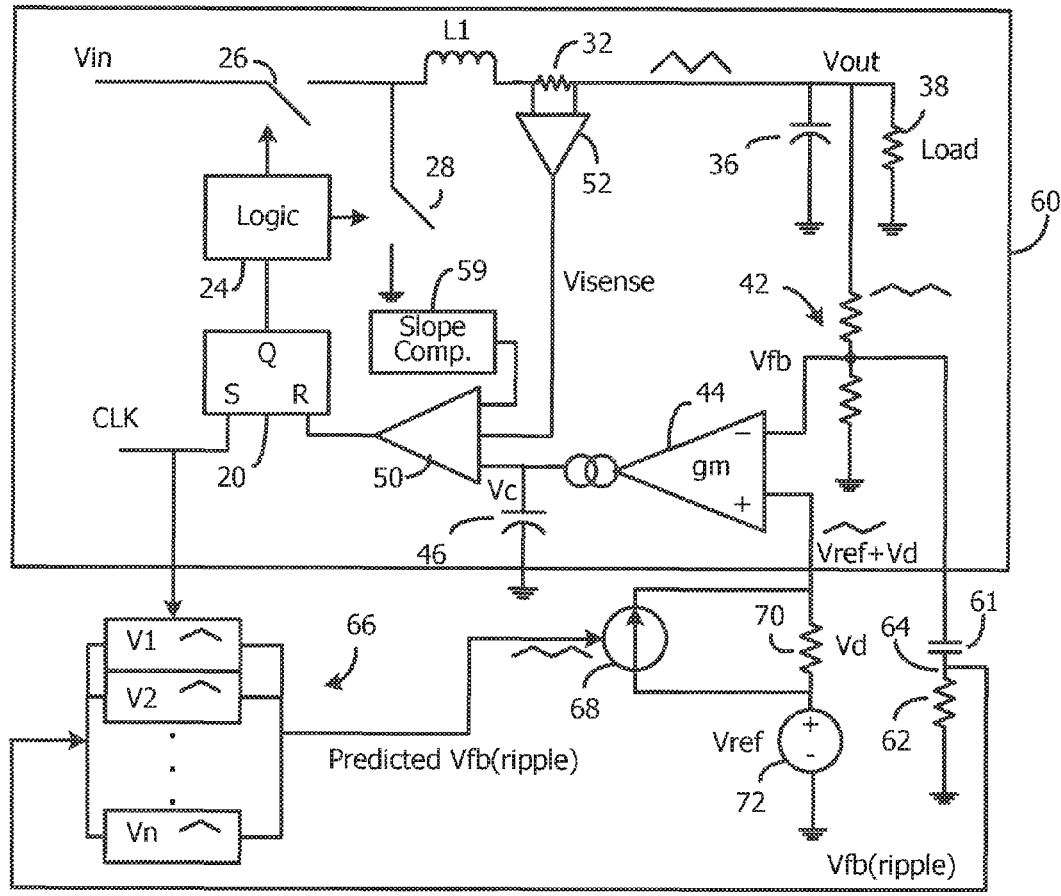
FIG. 3 illustrates a current mode converter in accordance with one embodiment of the present invention.

FIG. 3 illustrates one embodiment of the invention used in a current mode converter, although the invention may be used in voltage mode converters and other types of switching converters. A voltage mode converter compares the control voltage to a predetermined sawtooth waveform rather than to the current through the inductor. The invention may be used in conjunction with a switching buck converter, a boost converter, a buck-boost converter, a SEPIC converter, a Cuk converter, a flyback converter, a forward converter, a current regulator, a voltage regulator, etc. The converter portion 60 represents any conventional converter.

Figure 1:
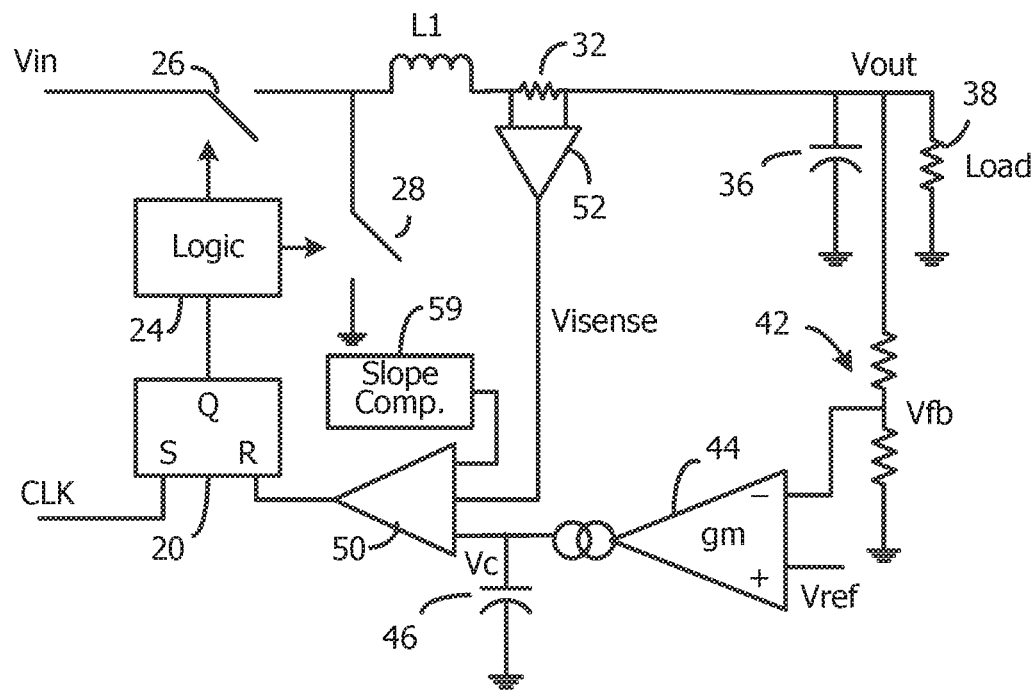
FIG. 1 illustrates a prior art DC/DC current mode converter.
Figure 2:
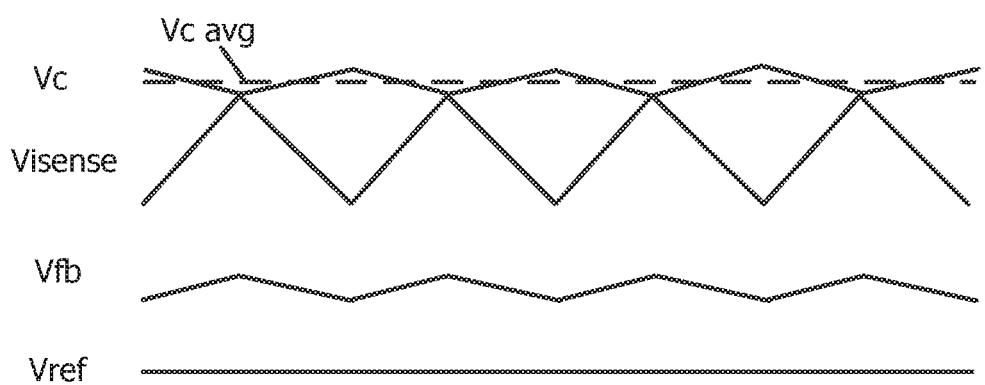
FIG. 2 illustrates the prior art waveforms Visense, Vc, Vfb, and Vref, as well as the tripping of the comparator at Visense values below the Vc average value.

The conventional aspects of the current mode converter of FIG. 3 are the same as in FIG. 1 so need not be repeated.

All such switching converters rely on a feedback voltage to regulate its output, and such feedback voltages include ripple. In FIG. 3, the DC component of the feedback voltage Vfb is filtered out by the capacitor 61 and resistor 62 network, so that only the feedback voltage ripple Vfb(ripple) is present at node 64.

It is assumed that the circuit is operating normally and experiences the typical slight variations in input voltage and load. Therefore, the characteristics of the feedback voltage Vfb and its ripple Vfb(ripple) may change slightly over a number of cycles. FIG. 3 illustrates a feedback voltage ripple Vfb(ripple) averaging circuit 66 that averages out the feedback voltage ripple Vfb(ripple) over a number of cycles so that the average feedback voltage ripple Vfb(ripple) is a typical predicted feedback voltage ripple Vfb(ripple). In one embodiment, the feedback voltage ripple Vfb(ripple) is averaged out over 30 switching cycles, which is enough to make small transients in the feedback voltage Vfb irrelevant. The feedback voltage ripple Vfb(ripple) may be averaged out over any number of cycles, such as from 10-50. Successive cycles of the feedback voltage ripple Vfb(ripple) are represented in the boxes labeled V1, V2, and Vn. The predicted feedback voltage ripple Vfb(ripple) should be fairly stable during steady state operation. A few ways of creating the predicted feedback voltage ripple Vfb(ripple) are described with respect to FIGS. 5-6.

The predicted feedback voltage ripple Vfb(ripple) is then applied to a controllable current source 68, whose output current is directly proportional to the predicted feedback voltage ripple Vfb(ripple). The current source 68 may be a MOSFET whose gate is coupled to the predicted feedback voltage ripple Vfb(ripple).

The output current is coupled across a resistor 70 to generate a voltage drop Vd. The resistor 70 value is selected such that the voltage Vd is precisely the predicted feedback voltage ripple Vfb(ripple).

The voltage drop Vd is added to the fixed reference voltage Vref, generated by the reference voltage source 72, and applied to the non-inverting input of the error amplifier 44 (a transconductance amplifier).

Figure 4:
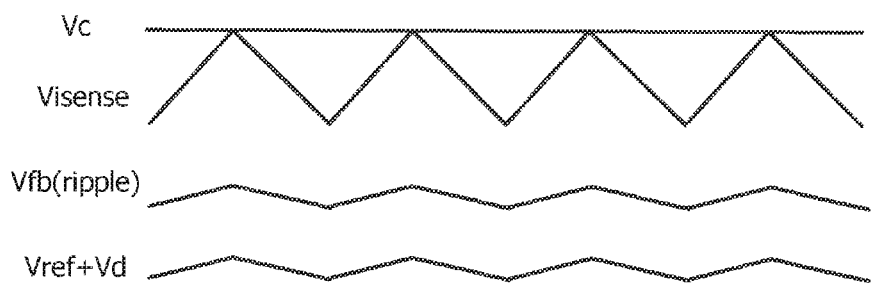
FIG. 4 illustrates the rippling of the Visense waveform and the predicted Vfb(ripple), generated in the circuit of FIG. 3, as well as the compensated reference voltage Vref and the non-rippling control voltage Vc, resulting in a more accurate tripping of the comparator.

FIG. 4 illustrates the feedback voltage ripple Vfb(ripple) portion of the full feedback voltage Vfb applied to the inverting input of the error amplifier 44, and also illustrates the sum of the voltage drop Vd and reference voltage Vref. The ripple component of the feedback voltage Vfb, which is Vfb(ripple), should be very similar to the voltage drop Vd so that the ripple components cancel out in the error amplifier 44. This results in a substantially non-rippling control voltage Vc, also shown in FIG. 4. When the voltage Visense, corresponding to the inductor current, crosses the control voltage Vc level (which may be compensated by the slope compensation circuit 59), the comparator 50 trips and turns off the switch 26 and turns on the synchronous rectifier switch 28 to regulate the peak current through the inductor L1, as described with respect to FIG. 1.

Since there is little or no ripple in the control voltage Vc, the capacitance values of capacitors 36 and 46 can be reduced to increase the gain-bandwidth product to improve the response time of the converter to transients. Further, since the control voltage Vc has substantially no ripple, the output voltage Vout will be more accurate.

Figure 5:
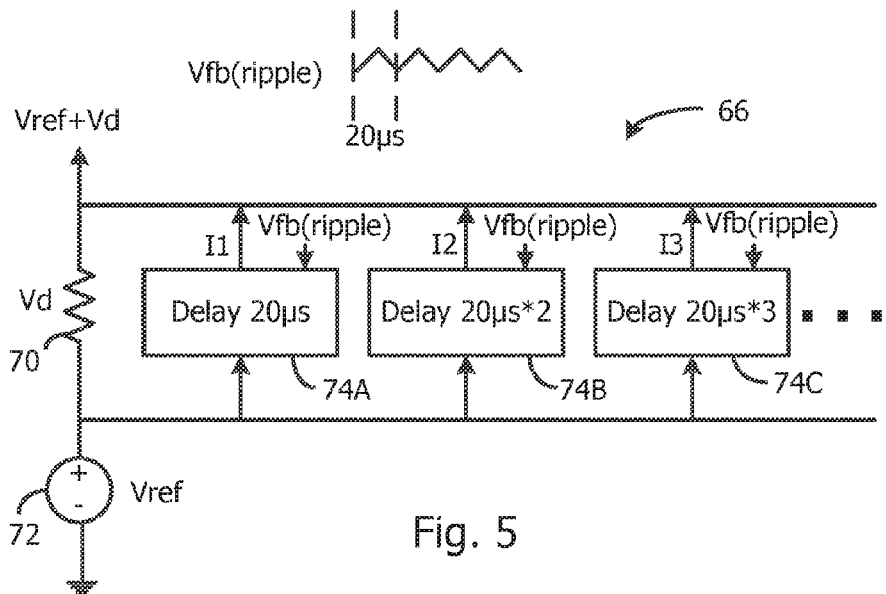
FIG. 5 illustrates how the predicted feedback voltage ripple Vfb(ripple) may be generated using delayed current sources connected in parallel, where there is one delayed current source per switching cycle to be averaged.

FIG. 5 illustrates one embodiment of the averaging circuit 66. Each delay circuit 74 delays a multiple of a switching period. In the example, only three delay circuits 74A, 74B, and 74C are shown, but there may be 30 or more delay circuits, each having a different delay. For example, if the converter CLK signal has a period of 20 microseconds, the feedback voltage ripple Vfb(ripple) would have a period of 20 microseconds. The present feedback voltage ripple Vfb (ripple) is applied to each of the delay circuits, where the delay circuit 74A delays the feedback voltage ripple Vfb (ripple) by a single period; the delay circuit 74B delays the same feedback voltage ripple Vfb(ripple) by two periods; and the delay circuit 74C delays the same feedback voltage ripple Vfb(ripple) by three periods. The delayed signals are applied to an associated current source, such as a MOSFET, which outputs the associated current I1, I2, and I3. The current sources are connected in parallel, so the sum of all the currents is an average of the differently delayed feedback voltage ripple Vfb(ripple) for any instant in the switching cycle. The currents generated and the value of the resistor 70 are selected so that the voltage drop across the resistor 70 (i.e., the predicted feedback voltage ripple Vfb(ripple)) is approximately equal to the present feedback voltage ripple Vfb(ripple).

Figure 6:
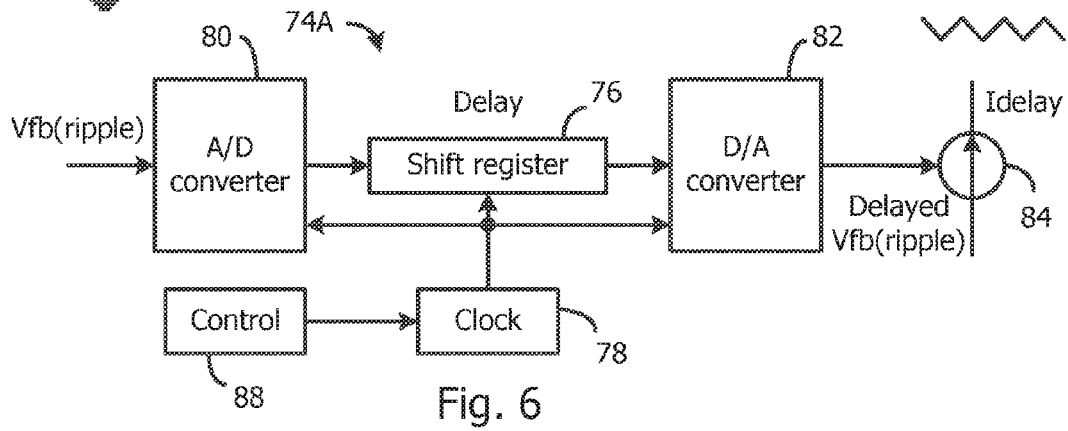
FIG. 6 illustrates one possible delay circuit that may be used for a single delay stage.

FIG. 6 is an example of a suitable digital delay circuit for a single delay stage (e.g., delay circuit 74A) where the number of serially-connected flip-flops in a clocked shift register 76 is selected to achieve a particular delay. Each delay circuit uses a different length shift register 76 clocked with the same clock 78. The feedback voltage ripple Vfb (ripple) is input to an analog-to-digital (A/D) converter 80 at a suitable sampling rate, and the digital Vfb(ripple) signals are applied to the input of the shift register 76. The data may be serial or parallel. The data is shifted along the shift register 76 at the clock rate until it is output to a digital-to-analog (D/A) converter 82, which outputs a delayed Vfb (ripple). The delayed feedback voltage ripple is then applied to a controllable current source 84, such as a MOSFET, after any suitable signal conditioning, to generate a current proportional to the delayed feedback voltage ripple. Many other types of known delay circuits can be used. The outputs of the various delay circuits are then averaged, as shown in FIGS. 3 and 5, to generate a predicted feedback voltage ripple to offset the actual feedback voltage ripple.

To account for variations in the frequency of the feedback voltage ripple, the clock frequency may be adjustable using a control circuit. For example, the "delay" clock 78 frequency may be based on the CLK signal in FIG. 3, used to reset the flip-flop 20, so that the delay circuit is synchronized with the ripple frequency.

Other techniques may be used to generate the predicted feedback voltage ripple Vfb(ripple).

Figure 7:
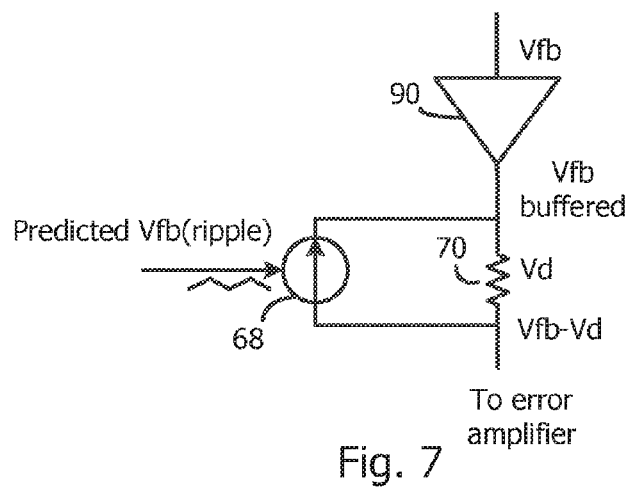
FIG. 7 illustrates a portion of a converter where the predicted feedback voltage ripple Vfb(ripple) is subtracted from the actual feedback voltage rather than added to the reference voltage.

Although embodiments have been described where the predicted feedback voltage ripple is added to the reference voltage, the same result may be achieved by subtracting the predicted feedback voltage ripple from the actual feedback voltage Vfb to create a compensated feedback voltage Vfb with less or no ripple, as shown in FIG. 7. This may be done by buffering the feedback voltage Vfb (to avoid affecting the resistor divider 42), using a conventional unity gain amplifier 90, and then applying the current source 68 and resistor 70 in the buffered feedback path to subtract the resistor's voltage drop Vd from the feedback voltage Vfb. Accordingly, the voltage provided to the inverting input of the amplifier 44 (FIG. 3) would be Vfb-Vd. The reference voltage Vref is unaffected.

The averaging circuit 66 (or other processing circuit for generating the predicted feedback voltage ripple) and related components can easily be added to any conventional converter. The various components of the averaging circuit 66 may be formed on the same integrated circuit as the converter controller.

While particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A switching converter comprising:

a transistor switch;

a voltage feedback circuit configured to generate a feedback voltage, the feedback voltage having a ripple component at a switching frequency of the transistor switch;

an error amplifier configured to generate a control signal for use in determining when to turn off the transistor switch during a switching cycle, the error amplifier having inputs comprising an inverting input and a non-inverting input;

a filter configured to pass the ripple component of the feedback voltage;

a processing circuit configured to process the ripple component of the feedback voltage over a number of switching cycles to derive a predicted ripple component of the feedback voltage;

a reference voltage generator configured to generate a reference voltage; and a combiner circuit configured to combine the predicted ripple component of the feedback voltage with one of the reference voltage or the feedback voltage before being applied to the respective inputs of the error amplifier to at least partially offset effects of the ripple component of the feedback voltage.

2. The converter of claim 1 wherein the combiner circuit is configured to combine the predicted ripple component of the feedback voltage with the reference voltage to obtain a compensated reference voltage, such that the compensated reference voltage has a ripple similar to the feedback voltage ripple component, wherein the compensated reference voltage is applied to a respective one of the inputs into the error amplifier, and the feedback voltage is applied to another respective one of the inputs into the error amplifier.

3. The converter of claim 1 wherein the combiner circuit is configured to combine the predicted ripple component of the feedback voltage with the feedback voltage to obtain a compensated feedback voltage, such that the compensated feedback voltage has a reduced ripple compared with the feedback voltage, wherein the reference voltage is applied to a respective one of the inputs into the error amplifier, and the compensated feedback voltage is applied to another respective one of the inputs into the error amplifier.

4. The converter of claim 1 wherein the processing circuit comprises an averaging circuit for averaging the ripple component of the feedback voltage over a number of switching cycles.

5. The converter of claim 1 wherein the processing circuit comprises:

a plurality of delay circuits configured to delay the ripple component of the feedback voltage by various multiples of a transistor switch switching period;

a plurality of current sources, the current sources being connected in parallel and generating currents corresponding to outputs of associated ones of the delay circuits; and a resistance connected in series with the reference voltage, a sum of the currents generated by the current sources being coupled through the resistance to generate a voltage drop substantially equal to the predicted ripple component of the feedback voltage.

6. The converter of claim 1 wherein the processing circuit comprises a plurality of digital delay circuits configured to delay the ripple component of the feedback voltage by various multiples of a transistor switch switching period.

7. The converter of claim 6 wherein the plurality of digital delay circuits are clocked by a clock signal, wherein the clock signal tracks a frequency of the ripple component.

8. The converter of claim 1 wherein the filter configured to pass the ripple component of the feedback voltage comprises a capacitor.

9. The converter of claim 1 wherein the converter is a current mode converter, the converter further comprising a slope compensation circuit generating a first ramping voltage, wherein the control voltage is combined with the first ramping voltage to create a compensated control voltage for comparison with a ramping inductor current sense signal.

10. The converter of claim 1 wherein the converter is a buck converter generating a regulated output voltage.

11. The converter of claim 1 wherein the converter is a boost converter generating a regulated output voltage.

12. The converter of claim 1 wherein the processing circuit is configured to process the ripple component of the feedback voltage over at least ten switching cycles to derive the predicted ripple component of the feedback voltage.

13. The converter of claim 1 wherein the error amplifier comprises a transconductance amplifier, the converter further comprising a capacitor coupled to an output of the error amplifier, wherein a voltage at a terminal of the capacitor is used to determine when to turn off the transistor switch during a switching cycle.

14. The converter of claim 1 wherein the converter is a current mode converter, the converter further comprising:
   an inductor configured to conduct a ramping inductor current as the transistor switch is turned on and off at a particular duty cycle and switching frequency;
   a current sensor configured to convert the ramping inductor current to a corresponding current sense signal, the current sense signal having ripple; and
   a comparator configured to receive at least the current sense signal, wherein tripping of the comparator turns off the transistor switch during a switching cycle.

15. A method performed by a switching converter comprising:
   turning on and off a transistor switch at a particular duty cycle and switching frequency;
   generating a feedback voltage, the feedback voltage having a ripple component;
   generating a control signal by an error amplifier, the error amplifier having inputs comprising an inverting input and a non-inverting input;
   turning off the transistor switch during a switching cycle when a first ramping voltage exceeds a threshold;
   filtering the feedback voltage to obtain the ripple component of the feedback voltage;
   processing the ripple component of the feedback voltage over a number of switching cycles to derive a predicted ripple component of the feedback voltage;
   generating a reference voltage; and
   combining the predicted ripple component of the feedback voltage with one of the reference voltage or the feedback voltage before being applied to respective inputs of the error amplifier to at least partially offset effects of the ripple component of the feedback voltage.

16. The method of claim 15 wherein the step of combining comprises combining the predicted ripple component of the feedback voltage with the reference voltage to obtain a compensated reference voltage, such that the compensated reference voltage has a ripple similar to the feedback voltage ripple component, wherein the compensated reference voltage is applied to a respective one of the inputs into the error amplifier, and the feedback voltage is applied to another respective one of the inputs into the error amplifier.

17. The method of claim 15 wherein the step of combining comprises combining the predicted ripple component of the feedback voltage with the feedback voltage to obtain a compensated feedback voltage, such that the compensated feedback voltage has a reduced ripple compared with the feedback voltage, wherein the reference voltage is applied to a respective one of the inputs into the error amplifier, and the compensated feedback voltage is applied to another respective one of the inputs into the error amplifier.

18. The method of claim 15 wherein the control voltage is used to set the threshold for turning off the transistor switch.

19. The method of claim 15 wherein the processing comprises averaging the ripple component of the feedback voltage over a number of switching cycles.

20. The method of claim 15 wherein the processing comprises:
   delaying the ripple component of the feedback voltage by various multiples of a transistor switch switching period;
   generating currents corresponding to an output of associated ones of the delay circuits, and summing the currents to create a summed current; and
   coupling the summed current across a resistance connected in series with the reference voltage to generate a voltage drop substantially equal to the predicted ripple component of the feedback voltage, wherein a sum of the reference voltage and the predicted ripple component of the feedback voltage forms the compensated reference voltage.

21. The method of claim 15 wherein filtering the feedback voltage to obtain the ripple component of the feedback voltage comprises filtering the feedback voltage by a capacitor to pass the ripple component of the feedback voltage.

22. The method of claim 15 wherein the converter is a current mode converter and wherein the first ramping voltage corresponds to a current through an inductor.

* * * * *